US006919271B2

(12) United States Patent
Gat

(10) Patent No.: US 6,919,271 B2
(45) Date of Patent: Jul. 19, 2005

(54) METHOD FOR RAPIDLY HEATING AND COOLING SEMICONDUCTOR WAFERS

(75) Inventor: Arnon Gat, Palo Alto, CA (US)

(73) Assignee: Mattson Technology, Inc., Fremont, CA (US)

( * ) Notice: Subject to any disclaimer, the term of this patent is extended or adjusted under 35 U.S.C. 154(b) by 0 days.

(21) Appl. No.: 10/646,144

(22) Filed: Aug. 22, 2003

(65) Prior Publication Data

US 2004/0035847 A1 Feb. 26, 2004

Related U.S. Application Data

(62) Division of application No. 09/197,284, filed on Nov. 20, 1998, now abandoned.

(51) Int. Cl.$^7$ ................................................ H01L 21/44
(52) U.S. Cl. ..................................... 438/663; 374/133
(58) Field of Search ................................ 438/166, 663; 374/133

(56) References Cited

U.S. PATENT DOCUMENTS

| | | | |
|---|---|---|---|
| 3,862,397 A | 1/1975 | Anderson et al. | |
| 3,895,967 A | 7/1975 | Anthony et al. | |
| 4,450,652 A | 5/1984 | Walsh | |
| 4,724,621 A | 2/1988 | Hobson et al. | |
| 4,747,928 A | 5/1988 | Takahashi et al. | |
| 4,811,493 A | 3/1989 | Burgio, Jr. | |
| 4,836,138 A | 6/1989 | Robinson et al. | |
| 4,857,689 A | * 8/1989 | Lee ............................ | 219/650 |
| 4,863,547 A | 9/1989 | Shidahara et al. | |
| 4,914,276 A | 4/1990 | Blair | |
| 4,924,073 A | 5/1990 | Chiba | |
| 4,949,783 A | 8/1990 | Lakios et al. | |
| 4,956,538 A | 9/1990 | Moslehi | |
| 5,002,010 A | 3/1991 | Weinberg | |
| 5,018,616 A | 5/1991 | Johnson et al. | |
| 5,033,407 A | 7/1991 | Mizuno et al. | |
| 5,060,354 A | 10/1991 | Chizinsky | |
| 5,108,792 A | 4/1992 | Anderson et al. | |
| 5,113,929 A | 5/1992 | Nakagawa et al. | |

(Continued)

FOREIGN PATENT DOCUMENTS

| | | |
|---|---|---|
| EP | 0780855 A2 | 6/1987 |
| EP | 0451740 A2 | 10/1991 |
| EP | 0454054 A2 | 10/1991 |
| EP | 0695922 A1 | 2/1996 |
| EP | 0821085 B1 | 1/1998 |
| EP | 0829904 A2 | 3/1998 |
| JP | 59275987 | 7/1986 |
| JP | 62035517 | 5/1988 |
| WO | WO 0145501 A3 | 6/2001 |
| WO | WO 0145501 A2 | 6/2001 |
| WO | WO 0046840 A1 | 8/2002 |

OTHER PUBLICATIONS

Abstract of Japanese Patent No. JP2139916, May 29, 1990.
Abstract of Japanese Patent No. JP2301173, Dec. 13, 1990.

(Continued)

*Primary Examiner*—George Fourson
*Assistant Examiner*—Fernando L. Toledo
(74) *Attorney, Agent, or Firm*—Dority & Manning, P.A.

(57) ABSTRACT

The present invention is directed to an apparatus and process for heating and cooling semiconductor wafers in thermal processing chambers. In particular, the apparatus of the present invention includes a cooling device for actively cooling the wafers after the wafers have been heated. During use, the cooling device can be movable towards and away from a wafer placed in the chamber for selectively cooling the wafer at desired times. In an alternative embodiment, a gas can be directed towards the wafer for rapidly reducing the temperature of the wafer at the completion of the process. Alternatively, the wafer can be lowered to close proximity of a cooling member to achieve active and selective cooling.

23 Claims, 3 Drawing Sheets

U.S. PATENT DOCUMENTS

| | | | |
|---|---|---|---|
| 5,129,360 A | | 7/1992 | Ahern et al. |
| 5,156,820 A | | 10/1992 | Wong et al. |
| 5,160,545 A | | 11/1992 | Maloney et al. |
| 5,177,878 A | | 1/1993 | Visser |
| 5,181,556 A | | 1/1993 | Hughes |
| 5,199,483 A | | 4/1993 | Bahng |
| 5,226,732 A | * | 7/1993 | Nakos et al. ............... 374/133 |
| 5,228,501 A | | 7/1993 | Tepman et al. |
| 5,248,370 A | | 9/1993 | Tsui et al. |
| 5,252,366 A | | 10/1993 | Ahern et al. |
| 5,287,914 A | | 2/1994 | Hughes |
| 5,290,381 A | | 3/1994 | Nozawa et al. |
| 5,300,453 A | | 4/1994 | Okamura et al. |
| 5,345,999 A | | 9/1994 | Hosokawa |
| 5,356,476 A | | 10/1994 | Foster et al. |
| 5,372,648 A | | 12/1994 | Yamamoto et al. |
| 5,414,244 A | | 5/1995 | Imahashi |
| 5,431,700 A | | 7/1995 | Sloan |
| 5,436,172 A | | 7/1995 | Moslehi |
| 5,443,997 A | | 8/1995 | Tsui et al. |
| 5,449,883 A | | 9/1995 | Tsuruta |
| 5,458,687 A | | 10/1995 | Shichida et al. |
| 5,478,401 A | | 12/1995 | Tsunekawa et al. |
| 5,520,742 A | | 5/1996 | Ohkase |
| 5,597,458 A | | 1/1997 | Sanchez, Jr. et al. |
| 5,609,689 A | | 3/1997 | Kato et al. |
| 5,620,560 A | | 4/1997 | Akimoto et al. |
| 5,660,472 A | | 8/1997 | Peuse et al. |
| 5,662,469 A | * | 9/1997 | Okase et al. .................... 432/6 |
| 5,673,750 A | | 10/1997 | Tsubone et al. |
| 5,743,643 A | | 4/1998 | Gronet et al. |
| 5,770,515 A | | 6/1998 | Meng et al. |
| 5,778,968 A | | 7/1998 | Hendrickson et al. |
| 5,781,693 A | | 7/1998 | Ballance et al. |
| 5,810,933 A | | 9/1998 | Mountsier et al. |
| 5,814,365 A | | 9/1998 | Mahawili |
| 5,820,942 A | | 10/1998 | Singh et al. |
| 5,834,068 A | | 11/1998 | Chern et al. |
| 5,846,375 A | | 12/1998 | Gilchrist et al. |
| 5,874,711 A | | 2/1999 | Champetier et al. |
| 5,881,208 A | | 3/1999 | Geyling et al. |
| 5,891,790 A | | 4/1999 | Keller et al. |
| 5,920,797 A | | 7/1999 | Ballance et al. |
| 5,926,742 A | | 7/1999 | Thakur et al. |
| 5,930,456 A | | 7/1999 | Vosen |
| 5,937,142 A | | 8/1999 | Moslehi et al. |
| 5,937,541 A | | 8/1999 | Weigand et al. |
| 5,944,857 A | | 8/1999 | Edwards et al. |
| 5,960,158 A | | 9/1999 | Gat et al. |
| 5,960,555 A | | 10/1999 | Deaton et al. |
| 5,965,047 A | * | 10/1999 | Blersch et al. .............. 219/390 |
| 5,970,214 A | | 10/1999 | Gat |
| 5,970,382 A | | 10/1999 | Shah |
| 5,980,637 A | | 11/1999 | Singh et al. |
| 5,990,016 A | | 11/1999 | Kim et al. |
| 5,997,175 A | | 12/1999 | Champetier et al. |
| 6,018,616 A | | 1/2000 | Schaper |
| 6,027,244 A | | 2/2000 | Champetier et al. |
| 6,034,357 A | | 3/2000 | Guardado |
| 6,056,434 A | | 5/2000 | Champetier |
| 6,073,366 A | | 6/2000 | Aswad |
| 6,075,922 A | | 6/2000 | Tay et al. |
| 6,097,005 A | | 8/2000 | Akimoto |
| 6,100,506 A | | 8/2000 | Colelli, Jr. et al. |
| 6,105,274 A | | 8/2000 | Ballantine et al. |
| 6,107,608 A | | 8/2000 | Hayes |
| 6,108,937 A | | 8/2000 | Raaijmakers |
| 6,114,662 A | | 9/2000 | Guidotti et al. |
| 6,133,550 A | * | 10/2000 | Griffiths et al. ............. 219/403 |
| 6,160,242 A | | 12/2000 | Guardado |
| 6,174,651 B1 | | 1/2001 | Thakur |
| 6,198,074 B1 | | 3/2001 | Savas |
| 6,200,023 B1 | | 3/2001 | Tay et al. |
| 6,200,634 B1 | | 3/2001 | Johnsgard et al. |
| 6,203,620 B1 | | 3/2001 | Moslehi |
| 6,204,484 B1 | | 3/2001 | Tay et al. |
| 6,209,220 B1 | | 4/2001 | Raaijmakers |
| 6,209,480 B1 | | 4/2001 | Moslehi |
| 6,210,484 B1 | | 4/2001 | Hathaway |
| 6,215,106 B1 | | 4/2001 | Boas et al. |
| 6,222,990 B1 | | 4/2001 | Guardado et al. |
| 6,232,580 B1 | | 5/2001 | Sandhu |
| 6,235,656 B1 | | 5/2001 | Clarke |
| 6,238,588 B1 | | 5/2001 | Collins et al. |
| 6,239,038 B1 | | 5/2001 | Wen |
| 6,280,790 B1 | | 8/2001 | White et al. |
| 6,281,141 B1 | | 8/2001 | Das et al. |
| 6,293,696 B1 | | 9/2001 | Guardado |
| 6,307,184 B1 | | 10/2001 | Womack et al. |
| 6,310,328 B1 | | 10/2001 | Gat |
| 6,359,263 B2 | | 3/2002 | Tay et al. |
| 6,387,182 B1 | | 5/2002 | Horie et al. |
| 6,403,923 B1 | | 6/2002 | Tay et al. |
| 6,408,537 B1 | | 6/2002 | Aswad |
| 6,414,276 B1 | | 7/2002 | Babikian |
| 6,423,947 B2 | | 7/2002 | Womack |
| 6,506,691 B2 | | 1/2003 | Cook et al. |
| 6,514,876 B1 | | 2/2003 | Thakur et al. |
| 6,559,424 B2 | | 5/2003 | O'Carroll et al. |
| 6,610,967 B2 | | 8/2003 | Gat |
| 6,638,876 B2 | | 10/2003 | Levy et al. |
| 6,717,158 B1 | | 4/2004 | Gat et al. |
| 6,727,474 B2 | | 4/2004 | Gat |
| 2002/0000194 A1 | | 1/2002 | Clarke |
| 2002/0017618 A1 | | 2/2002 | Gat et al. |
| 2002/0104205 A1 | | 8/2002 | Goodwin |
| 2002/0104619 A1 | | 8/2002 | Koren et al. |
| 2002/0121242 A1 | | 9/2002 | Minami et al. |
| 2002/0137311 A1 | | 9/2002 | Timans |
| 2003/0031793 A1 | | 2/2003 | Chang et al. |
| 2003/0124820 A1 | | 7/2003 | Johnsgard et al. |
| 2003/0209326 A1 | | 11/2003 | Lee et al. |
| 2003/0235983 A1 | | 12/2003 | Li et al. |
| 2003/0236642 A1 | | 12/2003 | Timans |
| 2004/0018008 A1 | | 1/2004 | Koren et al. |
| 2004/0025787 A1 | | 2/2004 | Selbrede et al. |
| 2004/0040508 A1 | | 3/2004 | Shajii et al. |
| 2004/0058557 A1 | | 3/2004 | Eisele et al. |
| 2004/0084437 A1 | | 5/2004 | Timans |

OTHER PUBLICATIONS

Abstract of Japanese Patent No. JP3259511, Nov. 19, 1991.

Abstract of Japanese Patent No. JP4058530, Feb. 25, 1992.

Abstract of Japanese Patent No. JP4176121, Jun. 23, 1992.

Abstract of Japanese Patent No. JP04266015, Sep. 22, 1992.

Abstract of Japanese Patent No. JP61142743, Jun. 30, 1986.

Abstract of Japanese Patent No. JP61156814, Jul. 16, 1986.

Abstract of Japanese Patent No. JP63124528, May 28, 1988.

Abstract of Japanese Patent No. JP62205626, Sep. 10, 1987.

Abstract of Japanese Patent No. JP6235517, Aug. 23, 1994.

Abstract of Japanese Patent No. JP9306979, Nov. 28, 1997.

* cited by examiner

METHOD FOR RAPIDLY HEATING AND COOLING SEMICONDUCTOR WAFERS

The present application is a divisional of U.S. application Ser. No. 09/197,284 filed on Nov. 20, 1998, now abandoned.

FIELD OF THE INVENTION

The present invention is generally directed to a method and apparatus for rapidly heating and rapidly cooling semiconductor wafers in a thermal processing chamber. More particularly, the present invention is directed to a rapid thermal processing apparatus that includes a cooling device for cooling semiconductor wafers rapidly after the wafers have been heated.

BACKGROUND OF THE INVENTION

A thermal processing chamber as used herein refers to a device that rapidly heats objects, such as semiconductor wafers. Such devices typically include a substrate holder for holding a semiconductor wafer and a thermal energy source, such as a light source that emits light energy for heating the wafer. During heat treatment, the semiconductor wafers are heated under controlled conditions according to a preset temperature regime. For monitoring the temperature of the semiconductor wafer during heat treatment, thermal processing chambers also typically include temperature sensing devices, such as pyrometers, that sense the radiation being emitted by the semiconductor wafer at a selected band of wavelengths. By sensing the thermal radiation being emitted by the wafer, the temperature of the wafer can be calculated with reasonable accuracy.

In alternative embodiments, instead of or in addition to using radiation sensing devices, thermal processing chambers can also contain thermocouples for monitoring the temperature of the wafers. Thermocouples measure the temperature of objects by direct contact.

Many semiconductor heating processes require a wafer to be heated to high temperatures so that various chemical and physical reactions can take place as the wafer is fabricated into a device. During rapid thermal processing, which is one type of processing, semiconductor wafers are typically heated by arrays of lights to temperatures, for instance, from about 400° C. to about 1,200° C., for times which are typically less than a few minutes. During these processes, one main goal is to heat the wafers as uniformly as possible.

More particularly, in the past, semiconductor wafers were heated according to a predetermined heating cycle. For instance, the wafers were typically heated from an initial temperature to a desired temperature at a very fast heating rate. The wafers were then maintained at the desired temperature for a time sufficient for desired processes to take place. For instance, during these heating cycles the wafers can be annealed or various coatings and films can be deposited onto the wafers, such as oxide films.

In order to complete the heating cycle, the light sources are switched off and the wafers were allowed to cool after being maintained at a desired temperature for a predetermined amount of time. In general, the wafers were allowed to cool naturally by simply removing or turning off the heating source. In particular, the wafers would cool by the loss of energy through radiation from a hot body. The amount of energy that is lost from the wafer is proportional to the difference between the temperature of the wafer and the temperature of the surrounding atmosphere. Consequently, during these processes, the cooling rate of the wafers is relatively fast at high temperatures and then slows down exponentially as the temperature of the wafer decreases.

Recently, emphasis has been placed upon forming integrated circuits having thinner and more uniform layers that are more efficient and require less power to operate. In this regard, recent focus has turned to not only more precisely forming coatings and films in thermal processing chambers but also on reducing the length of time it takes to complete a heating cycle in the chamber. Unfortunately, however, conventional methods for cooling wafers in thermal processing chamber have frustrated these objectives.

For instance, as described above, conventional methods for cooling wafers in thermal processing chambers have a tendency to greatly increase the time it takes to complete a heating cycle within the chamber in that the wafers are cooled relatively slowly. Further, during this slow cooling phase of the cycle, unwanted chemical and physical reactions can occur which can adversely affect the electrical properties of coatings and films formed on the semiconductor wafer.

As such, a need currently exists for an improved apparatus and process for cooling wafers in rapid thermal processing chambers. In particular, a need currently exists for a rapid thermal processing chamber that is capable of actively cooling semiconductor wafers very rapidly after the wafers have been heated.

SUMMARY OF THE INVENTION

The present invention recognizes and addresses the foregoing disadvantages and others of prior art constructions and methods.

Accordingly, it is an object of the present invention to provide an improved method and apparatus for heat treating objects, such as semiconductor wafers.

Another object of the present invention is to provide an improved apparatus for heat treating semiconductor wafers that is capable of cooling the wafers rapidly.

Still another object of the present invention is to provide an improved apparatus for heat treating semiconductor wafers that includes a cooling device that actively cools the wafers after the wafers have been heated.

These and other objects of the present invention are achieved by providing an apparatus for heat treating semiconductor wafers during the process of producing integrated circuits. The apparatus can be used for various operations such as for annealing wafers after an ion implantation step, or for constructing or annealing coatings and films on semiconductor wafers, such as those made from conductive materials, insulators, and semiconductive materials. The apparatus includes a thermal processing chamber adapted to contain semiconductor wafers. A substrate holder can be contained within the thermal processing chamber for holding and rotating the wafers. For heating the wafers, a heat source can be placed in communication with the thermal processing chamber. The heat source can be, for instance, a plurality of lamps which emit thermal light energy.

In accordance with the present invention, the apparatus further includes a cooling device located proximate to the substrate holder for selectively cooling semiconductor wafers contained in the thermal processing chamber. The cooling device includes a cooling member which defines at least one cooling channel for circulating a cooling fluid, such as a liquid. In particular, by circulating a cooling fluid through the cooling member, the cooling device maintains a relatively low temperature that is then used to cool semiconductor wafers through convection and conduction.

Preferably, the cooling device of the present invention is only used to cool the semiconductor wafers at selected times, such as after the wafers have been heated to a predetermined maximum temperature. For instance, in one embodiment, the cooling device can include a movement mechanism for moving the cooling device between an engagement position and a non-engagement position. In the engagement position, the cooling device is placed adjacent to and possibly in direct contact with the semiconductor wafer held on the substrate holder for cooling the wafer. In the non-engagement position, on the other hand, the cooling device is spaced a determined distance from the semiconductor wafer and does not substantially cool the wafer or interfere with the wafer while the wafer is being heated. Alternatively, instead of the cooling device being movable towards and away from the substrate holder for selectively cooling the wafer, the substrate holder can be movable towards and away from the cooling device.

In a further embodiment of the present invention, the cooling device can be stationary and can include one or more gas passages for circulating a gas therethrough. In particular, the gas passages can be designed such that a gas flowing through the passages is cooled by the cooling fluid being circulated through the cooling device. Once cooled, the gas can then be directed towards and can contact a semiconductor wafer held on the substrate holder for cooling the wafer. The cooling gas can be, for instance, molecular nitrogen or helium. In order to only cool the wafer at selected times, the flow of cooling gases through the cooling device can be stopped and started when desired.

In one preferred embodiment of the present invention, the apparatus further includes a temperature sensing device for monitoring the temperature of a semiconductor wafer contained within the thermal processing chamber. A controller can be placed in communication with the temperature sensing device and can also be configured to control the heat source and the cooling device. Specifically, the controller can receive temperature information from the temperature sensing device and, based on such information, can automatically control the heat source and the cooling device for heating and cooling wafers according to a predetermined temperature cycle.

In controlling the heat source, for instance, the controller can be used to increase or decrease the amount of thermal energy being emitted onto the semiconductor wafer. In controlling the cooling device, on the other hand, the controller can be configured to control the movement of the cooling device and/or the flow of the cooling fluids in and out of the cooling device.

Other objects, features and aspects of the present invention are discussed in greater detail below.

BRIEF DESCRIPTION OF THE DRAWINGS

A full and enabling disclosure of the present invention, including the best mode thereof, directed to one of ordinary skill in the art, is set forth more particularly in the remainder of the specification, which makes reference to the appended figures in which.

Repeat use of references characters in the present specification and drawings is intended to represent same or analogous features or elements of the invention.

DETAILED DESCRIPTION OF THE PREFERRED EMBODIMENTS

It is to be understood by one of ordinary skill in the art that the present discussion is a description of exemplary embodiments only, and is not intended as limiting the broader aspects of the present invention, which broader aspects are embodied in the exemplary construction.

In general, the present invention is directed to an apparatus and method for heating and cooling wafers in a thermal processing chamber. For heating semiconductor wafers, the thermal processing chamber can contain conventional heating sources, such as a plurality of lamps that emit radiant energy. In accordance with the present invention, the apparatus further contains a cooling device that actively cools the semiconductor wafers after the wafers have been heated. The cooling device can take on various forms and can function in different manners. For instance, in one embodiment, the cooling device can include a cooling member which receives a cooling fluid for maintaining the cooling device at a lower temperature. The cooling device can further include a mechanism that is configured to cool the wafers only at selected times.

Various advantages and benefits are achieved through the apparatus and process of the present invention. For instance, through the use of the cooling device, the time it takes to complete a heating cycle in an apparatus of the present invention is substantially reduced. By reducing the length of time it takes to complete a heating cycle, thermal processing chambers made in accordance with the present invention are particularly well adapted to cause effective annealing of damage and activation of ion implanted impurities in the silicon, to form ultrathin coatings and films on semiconductor wafers, and to anneal thin films, conductive or insulating, which were previously deposited on semiconductor wafers. The thermal processing chamber of the present invention is also capable of forming very uniform coatings and films with improved electrical properties. In particular, according to the present invention, semiconductor wafers can be cooled very rapidly which "freezes" the chemical and physical reactions at a high temperature that are occurring in the chamber. In other words, cooling the wafers very rapidly prevents and inhibits unwanted and undesired chemical and physical reactions to occur during the relatively slow cool down phase of the heat cycle.

Figure 1:
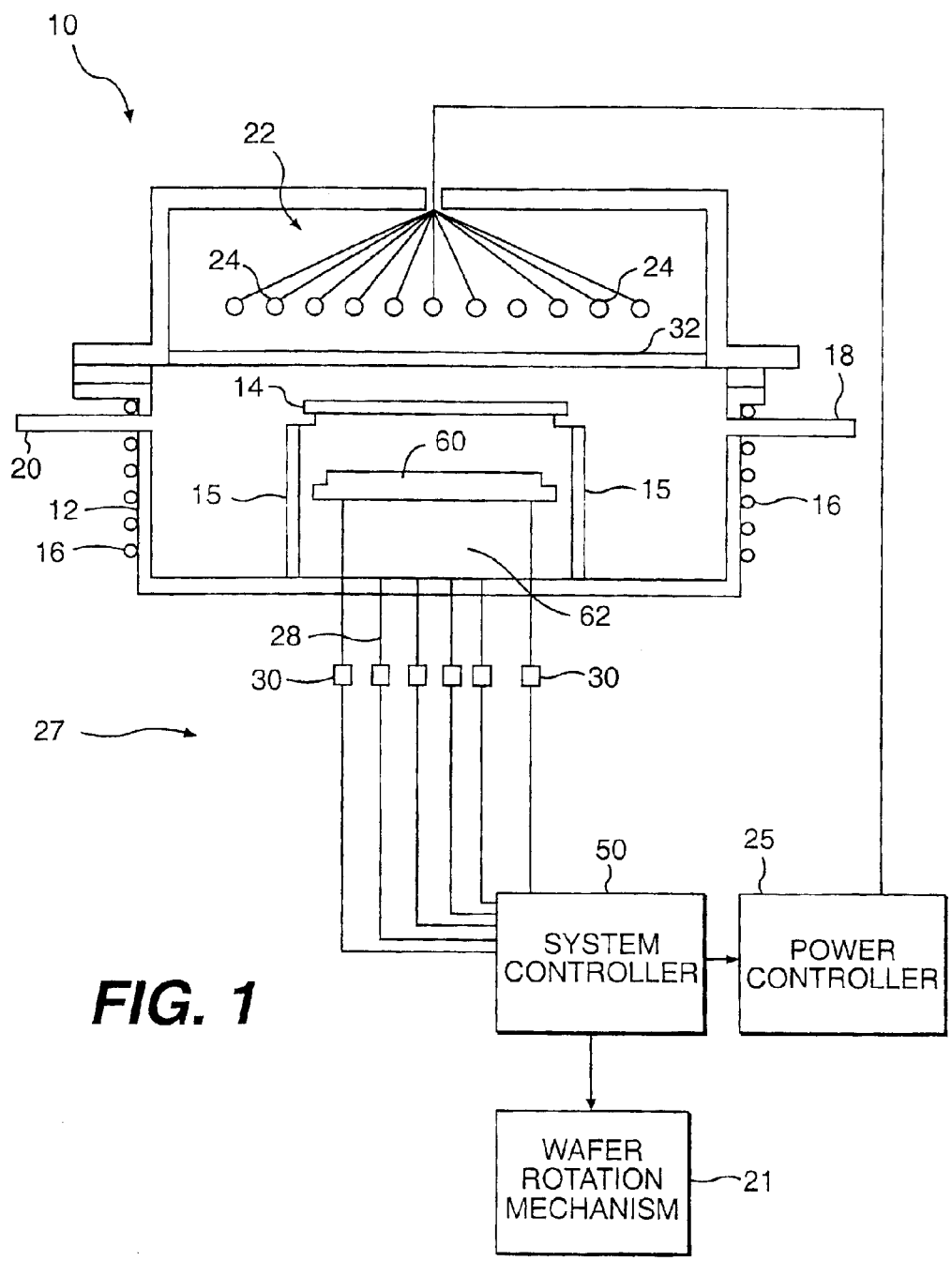
FIG. 1 is a cross-sectional view of one embodiment of an apparatus for heat treating semiconductor wafers in accordance with the present invention.

Referring to FIG. 1, a system generally 10 made in accordance with the present invention for heat treating a wafer made from a semiconductive material, such as silicon, is illustrated. System 10 includes a processing chamber 12 adapted to receive substrates such as a wafer 14 for conducting various processes. As shown, wafer 14 is positioned on a substrate holder 15 made from a thermal insulating material such as quartz. Chamber 12 is designed to heat wafer 14 at very rapid rates and under carefully controlled conditions. Chamber 12 can be made from various materials, including metals. For instance, chamber 12 can be made from stainless steel, brass or aluminum.

When chamber 12 is made from a heat conductive material, preferably the chamber includes a cooling system.

For instance, as shown in FIG. 1, chamber 12 includes a cooling conduit 16 wrapped around the perimeter of the chamber. Conduit 16 is adapted to circulate a cooling fluid, such as water, which is used to maintain the walls of chamber 12 at a relatively low temperature.

Chamber 12 can also include a gas inlet 18 and a gas outlet 20 for introducing a gas into the chamber and/or for maintaining the chamber within a preset pressure range. For instance, a gas can be introduced into chamber 12 through gas inlet 18 for reaction with wafer 14 in order to form, for example, oxide coatings, conductive layers, etc. Once processed, the gas can then be evacuated from the chamber using gas outlet 20.

Alternatively, an inert gas can be fed to chamber 12 through gas inlet 18 for preventing any unwanted or undesirable side reactions from occurring within the chamber. In a further embodiment, gas inlet 18 and gas outlet 20 can be used to pressurize chamber 12. A vacuum can also be created in chamber 12 when desired, using gas outlet 20 or an additional larger outlet positioned beneath the level of the wafer.

During processing, substrate holder 15, in one embodiment, can be adapted to rotate wafer 14 using a wafer rotation mechanism 21. Rotating the wafer promotes greater temperature uniformity over the surface of the wafer and promotes enhanced contact between wafer 14 and any gases introduced into the chamber. It should be understood, however, that besides wafers, chamber 12 is also adapted to process optical parts, films, fibers, ribbons, and other substrates having any particular shape.

A heat source or heating device generally 22 is included in communication with chamber 12 for heating wafer 14 during processing. Heating device 22 includes a plurality of lamps 24, such as tungsten-halogen lamps. As shown in FIG. 1, lamps 24 are placed above wafer 14. It should be understood, however, that lamps 24 may be placed at any particular location. Further, additional lamps could be included within system 10 if desired.

The use of lamps 24 as a heat source is generally preferred. For instance, lamps have much higher heating and cooling rates than other heating devices, such as electrical elements or conventional furnaces. Lamps 24 create a rapid isothermal processing system that provide instantaneous energy, typically requiring a very short and well controlled start up period. The flow of energy from lamps 24 can also be abruptly stopped at any time. As shown in the figure, lamps 24 are equipped with a gradual power controller 25 that can be used to increase or decrease the radiant energy being emitted by any of the lamps.

In order to monitor the temperature of wafer 14 during the heating process, in this embodiment, thermal processing chamber 12 includes plurality of radiation sensing devices generally 27. Radiation sensing devices 27 include a plurality of optical fibers or light pipes 28 which are, in turn, in communication with a plurality of corresponding light detectors 30. Optical fibers 28 are configured to receive thermal energy being emitted by wafer 14 at a particular wavelength. The amount of sensed radiation is then communicated to light detectors 30 which generate a usable voltage signal for determining the temperature of the wafer which can be calculated based, in part, on Planck's Law. In one embodiment, each optical fiber 28 in combination with a light detector 30 comprises a pyrometer.

In general, thermal processing chamber 12 can contain one or a plurality of radiation sensing devices. In a preferred embodiment, as shown in FIG. 1, thermal processing chamber 12 contains a plurality of radiation sensing devices that measure the temperature of the wafer at different locations. Knowing the temperature of the wafer at different locations can then be used to control the amount of heat being applied to the wafer.

During the process of the present invention, system 10 should be designed such that optical fibers 28 only detect thermal radiation being emitted by wafer 14 and not detect radiation being emitted by lamps 24. In this regard, system 10 includes a filter 32 which prevents thermal radiation being emitted by lamps 24 at the wavelength at which light detectors 30 operate from entering chamber 12. Filter 32 also serves to isolate lamps 24 from wafer 14 and prevent contamination of the chamber. Filter 32 as shown in FIG. 1 can be a window positioned between chamber 12 and heat source 22 and can be made from, for instance, fused silica or quartz. In an alternative embodiment, each lamp 24 can be covered by a separate filter.

Besides using radiation sensing devices, other temperature sensing devices may be used in the system of the present invention. For instance, one or more thermocouples may be incorporated into the system for monitoring the temperature of the wafer at a single location or at a plurality of locations. The thermocouples can be placed in direct contact with the wafer or can be placed adjacent the wafer from which the temperature can be extrapolated.

System 10 further includes a system controller 50 which can be, for instance, a microprocessor. Controller 50 receives voltage signals from light detectors 30 that represent the radiation amounts being sampled at the various locations. Based on the signals received, controller 50 is configured to calculate the temperature of wafer 14 at different locations.

System controller 50 as shown in FIG. 1 can also be in communication with lamp power controller 25. In this arrangement, controller 50 can determine the temperature of wafer 14, and, based on this information, control the amount of thermal energy being emitted by lamps 24. In this manner, instantaneous adjustments can be made regarding the conditions within reactor 12 for processing wafer 14 within carefully controlled limits.

In one embodiment, controller 50 can also be used to automatically control other elements within the system. For instance, controller 50 can be used to control the flow rate of gases entering chamber 12 through gas inlet 18. As shown, controller 50 can further be used to control the rate at which wafer 14 is rotated within the chamber.

In accordance with the present invention, as shown in FIG. 1, system 10 further includes a cooling device 60 positioned in thermal processing chamber 12. As shown, in this embodiment, cooling device 60 is located below semiconductor wafer 14 and is mounted on a base 62. Cooling device 60 is for actively and rapidly cooling wafer 14 at selected times with the thermal processing chamber, particularly after the wafer has been heated to a predetermined processing temperature.

Figure 2:
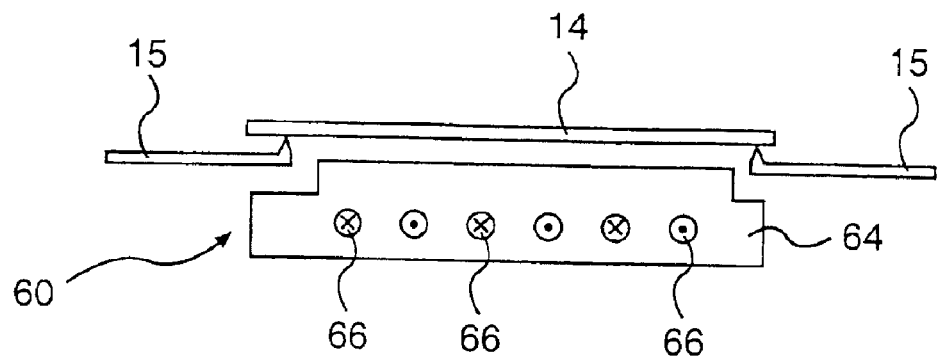
FIG. 2 is a cross-sectional view of one embodiment of a cooling device that may be used in a thermal processing chamber in accordance with the present invention.
Figure 3:
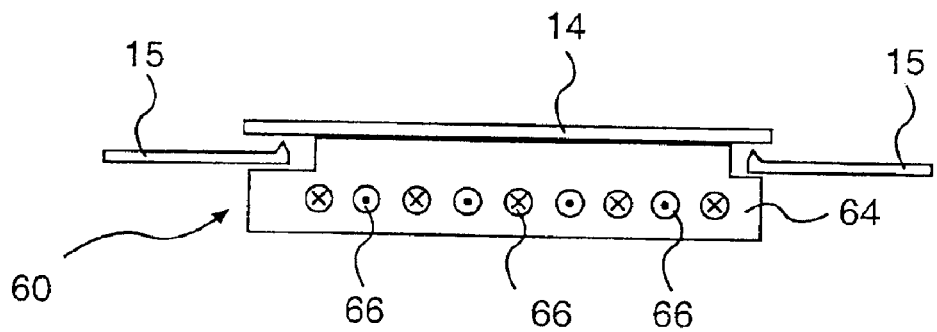
FIG. 3 is a cross-sectional view of the cooling device illustrated in FIG. 2.

In accordance with the present invention, cooling device 60 can be constructed in various ways and can include different mechanisms for cooling wafers. Referring to FIGS. 2 and 3, one embodiment of a cooling device made in accordance with the present invention is illustrated. In this embodiment, cooling device 60 includes cooling member 64 having a plate-like shape. Cooling member 64 includes cooling channels 66 which are designed to receive the flow of a cooling fluid therethrough. For instance, cooling member 64 can be placed in communication with a cooling fluid source, such as a water source, which supplies a cooling fluid to cooling channel 66. The cooling fluid maintains the temperature of cooling member 64 at a relatively low temperature thus allowing cooling device 60 to actively cool semiconductor wafer 14 through the direct exchange of thermal energy between the wafer and the cooling member.

As described above, preferably cooling device 60 only cools the wafer at selected times during the course of a heating cycle being performed in the chamber. Consequently, as shown in FIGS. 2 and 3, cooling device 60 can be movable towards and away from wafer 14. For example, base 62 as shown in FIG. 1 can include a mechanism which raises and lowers the cooling device at selected times.

For instance, cooling device 60 can be movable between a wafer nonengagement position as shown in FIG. 2 and a wafer engagement position as shown in FIG. 3. In the nonengagement position, cooling device 60 should be spaced from wafer 14 a distance sufficient so as to not interfere with the wafer as it is being heated. Once the wafer has been heated and needs to be cooled, however, cooling device 60 can be placed adjacent to the wafer as shown in FIG. 3. Specifically, cooling device 60 can be placed directly in contact with the wafer or can be moved very close to the wafer without touching the wafer depending upon the particular application. When placed in the engagement position as shown in FIG. 3, wafer 14 is rapidly cooled.

It should be understood, however, that besides cooling device 60 being movable towards and away from the wafer, alternatively, substrate holder 15 can be configured to move the wafer itself towards and away from the cooling device.

Further, besides adjusting the position of the cooling device in relation to the wafer, other controls can be used to selectively cool wafers according to the present invention. For instance, the flow of a cooling fluid through cooling channels 66 of cooling device 60 can be adjusted depending upon the amount of cooling that is desired at any particular time. For instance, when cooling is not desired, the flow of a cooling fluid to cooling device 60 can be slowed or stopped. Conversely, when it is desired to cool the wafer, the flow of a cooling fluid can be increased through the cooling device. In one embodiment, system controller 50 as shown in FIG. 1 can be placed in communication with cooling device 60 for automatically adjusting the position of the cooling device and/or controlling the flow of a cooling fluid to a device.

Cooling member 64 of cooling device 60 can be made from various materials. In particular, cooling member 64 should be made from a conductive material that acts as a heat exchanger between the cooling fluid and semiconductor wafer 14. Various materials that may be used to construct cooling member 64 include, for instance, a metal, such as aluminum, stainless steel or brass. This metal may be coated to prevent contamination between it and the semiconductor wafer.

Figure 4:
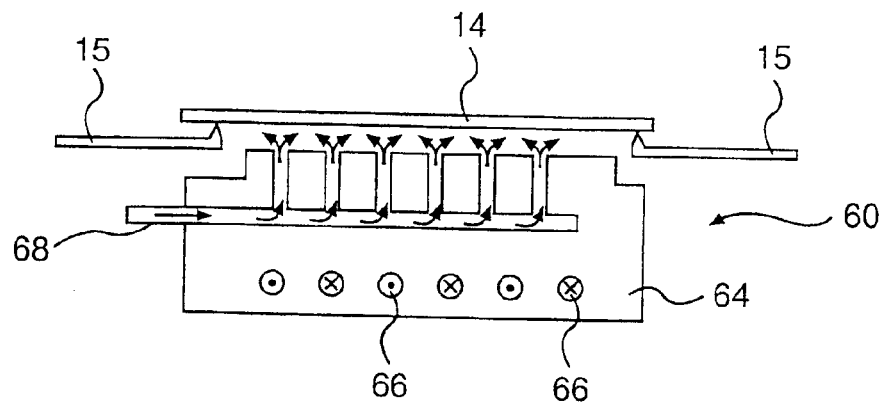
FIG. 4 is an alternative embodiment of a cooling device that may be used in a thermal processing chamber in accordance with the present invention.

Referring to FIG. 4, an alternative embodiment of a cooling device 60 that may be used in the apparatus and process of the present invention is illustrated. Similar to the embodiment illustrated in FIGS. 2 and 3, in this embodiment, cooling device 60 includes a cooling member 64 that defines one or more cooling channels 66 for circulating a cooling fluid, such as a liquid. In this embodiment, however, cooling member 64 further defines at least one gas passage 68.

Gas passage 68 is designed to be connected to a gas source that circulates a gas through cooling device 60. As shown, gas passage 68 flows through cooling member 64 and then includes a plurality of exits that release a gas adjacent to semiconductor wafer 14. In this manner, a gas being fed through gas passage 68 is cooled by a cooling fluid being circulated through channel 66 and is then directed towards semiconductor wafer 14 for cooling the wafer. The gas being fed through gas passage 68 should be an inert gas so that no undesired chemical reactions occur. For instance, molecular nitrogen, argon or helium can be used as the cooling gas.

In the embodiment illustrated in FIG. 4, cooling device 60 can be stationary or can be movable similar to the embodiment illustrated in FIGS. 2 and 3. Preferably, in order to selectively cool wafers within a thermal processing chamber, the flow of the cooling gas into gas passage 68 should be controllable so that the gas flow can be stopped and started at desired times. In this regard, system controller 50 as shown in FIG. 1 can be placed in communication with the cooling gas source and can be designed to control the flow of the cooling gas from the gas source to cooling device 60.

It should be understood that besides the embodiments illustrated in the figures, cooling device 60 can be cooled in various other ways. For instance, in an alternative embodiment, an active cooling structure can be placed adjacent to or can be attached to cooling device 60 for cooling the device through conduction. Alternatively, cooling device 60 can include a cooling member made from a thermoelectric material which maintains the cooling member at a lower temperature.

Figure 5:
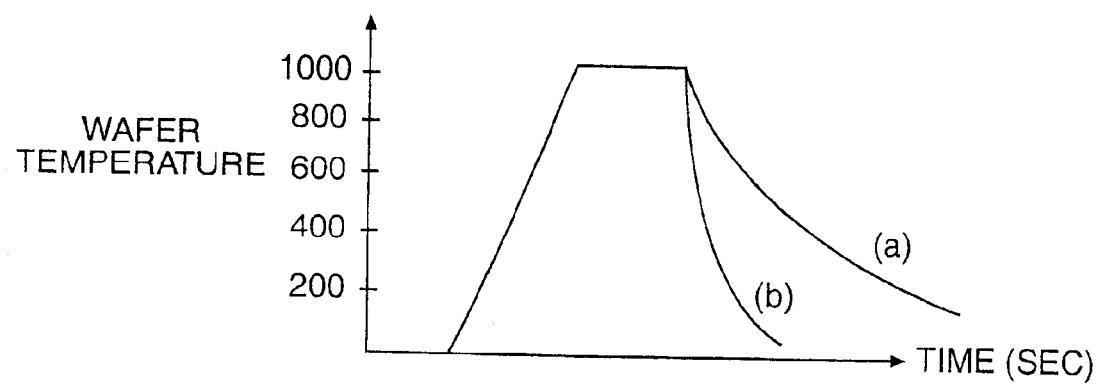
FIG. 5 is a time and temperature graph illustrating the difference between conventional heating cycles and heating cycles that may be used in a thermal processing chamber made in accordance with the present invention.

As described above, the purpose of cooling device 60 is to rapidly cool wafers in thermal processing chambers in order to increase the speed at which heating cycles can be performed on wafers in the chamber. Referring to FIG. 5, for comparative purposes, a conventional heating cycle (a) is shown in comparison to a heating cycle (b) that can be produced using the apparatus of the present invention. As shown, the cooling rate using the apparatus of the present invention is dramatically increased. Of course, the graph illustrated in FIG. 5 is for exemplary purposes only. It should be understood that with the cooling device of the present invention, the rate of cooling can be controlled such that any desired cooling curve can be followed.

For most applications, however, the cooling device of the present invention will be used to cool wafers as rapidly as possible. By cooling wafers rapidly, various advantages will result. For instance, besides reducing the amount of time it will take to process wafers, less undesirable chemical and physical reactions will occur during the cool down phase of the heating cycle.

These and other modifications and variations to the present invention may be practiced by those of ordinary skill in the art, without departing from the spirit and scope of the present invention, which is more particularly set forth in the appended claims. In addition, it should be understood that aspects of the various embodiments may be interchanged both in whole or in part. Furthermore, those of ordinary skill in the art will appreciate that the foregoing description is by way of example only, and is not intended to limit the invention so further described in such appended claims.

What is claimed is:

1. A method for rapidly heating and cooling semiconductor wafers in a thermal processing chamber, said method comprising the steps of:

placing a semiconductor wafer in a substrate holder contained in a thermal processing chamber;

rapidly heating said semiconductor wafer to a predetermined temperature using a heat source; and cooling said semiconductor wafer using an active cooling device, said cooling device comprising a cooling member maintained at a temperature lower than the wafer; wherein said cooling member defines one or more cooling channels for circulating a cooling fluid therethrough and defines one or more gas passages for flowing a cooling gas therethrough; and wherein said gas passages are configured to direct said cooling gas towards said semiconductor wafer and said substrate holder so that said cooling gas contacts said semiconductor wafer and cools said wafer.

2. The method of claim 1, wherein said cooling gas is cooled by said cooling member.

3. The method of claim 1, wherein said cooling gas is cooled by said cooling fluid circulating through said cooling channels.

4. The method of claim 1, wherein said cooling fluid is a liquid.

5. The method of claim 4, wherein said liquid is water.

6. The method of claim 1, wherein said cooling fluid is a gas.

7. The method of claim 1, further comprising adjusting the flow of said cooling gas through said one or more gas passages for controlling the cooling of said semiconductor wafer.

8. The method of claim 1, further comprising adjusting the circulation of said cooling fluid through said one or more cooling channels for controlling the cooling of said semiconductor wafer.

9. The method of claim 1, wherein said cooling device selectively cools said semiconductor wafer.

10. The method of claim 1, wherein said cooling device is stationary relative to said semiconductor wafer and said substrate holder.

11. The method of claim 1, wherein said cooling device is movable relative to said semiconductor wafer and said substrate holder.

12. The method of claim 1, wherein said substrate holder is adapted to hold and rotate said semiconductor wafer.

13. The method of claim 1, wherein said heat source includes one or more lamps.

14. The method of claim 1, wherein said cooling gas is an inert gas.

15. The method of claim 1, wherein said cooling gas is molecular nitrogen, argon, or helium.

16. The method of claim 1, further comprising monitoring the temperature of said semiconductor wafer while said wafer is in said thermal processing chamber.

17. The method of claim 16, wherein a temperature sensing device monitors the temperature of said semiconductor wafer.

18. The method of claim 17, wherein said temperature sensing device is configured to monitor the temperature of said semiconductor wafer at a single location on said wafer or at a plurality of locations on said wafer.

19. The method of claim 17, wherein said temperature sensing device is in communication with a controller, and wherein said controller receives temperature information from said temperature sensing device and, based on said information, controls the heating and cooling of said semiconductor wafer.

20. The method of claim 19, wherein said controller is in communication with said heat source, and wherein said controller receives temperature information from said temperature sensing device and, based on said information, controls said heat source for controlling the heating of said semiconductor wafer.

21. The method of claim 19, wherein said cooling device further comprises a gas source for supplying said gas to said one or more gas passages, said gas source being in communication with said controller such that said controller is configured to control the flow of gas from said gas source to said gas passages for controlling the cooling of said semiconductor wafer.

22. The method of claim 21, wherein said controller controls the flow of gas from said gas source to said gas passages based on temperature information received from said temperature sensing device.

23. A method for rapidly heating and cooling semiconductor wafers in a thermal processing chamber, said method comprising the steps of:

placing a semiconductor wafer in a substrate holder contained in a thermal processing chamber;

rapidly heating said semiconductor wafer to a predetermined temperature using a heat source, wherein said heat source includes one or more lamps;

cooling said semiconductor wafer using an active cooling device, said cooling device comprising a cooling member maintained at a temperature lower than the wafer; wherein said cooling member defines one or more cooling channels for circulating a cooling fluid therethrough and defines one or more gas passages for flowing a cooling gas therethrough; wherein said gas passages are configured to direct said cooling gas towards said semiconductor wafer and said substrate holder so that said cooling gas contacts said semiconductor wafer and cools said wafer; and monitoring the temperature of said semiconductor wafer during said heating and said cooling using a temperature sensing device.

* * * * *